(12) United States Patent
Jooyaie et al.

(10) Patent No.: US 9,093,978 B2
(45) Date of Patent: Jul. 28, 2015

(54) MULTI-LOOP TRANSFORMER HAVING WIDEBAND FREQUENCY APPLICATIONS

(71) Applicant: QUALCOMM Incorporated, San Diego, CA (US)

(72) Inventors: Alborz Jooyaie, Irvine, CA (US); Shervin Moloudi, Los Angeles, CA (US)

(73) Assignee: QUALCOMM Incorporated, San Diego, CA (US)

( * ) Notice: Subject to any disclaimer, the term of this patent is extended or adjusted under 35 U.S.C. 154(b) by 95 days.

(21) Appl. No.: 13/872,894

(22) Filed: Apr. 29, 2013

(65) Prior Publication Data
US 2014/0320230 A1  Oct. 30, 2014

(51) Int. Cl.
*H03H 5/00* (2006.01)
*H03H 7/42* (2006.01)
*H01F 27/28* (2006.01)

(52) U.S. Cl.
CPC ............ *H03H 7/42* (2013.01); *H01F 27/2804* (2013.01)

(58) Field of Classification Search
USPC ...................................... 333/25, 26
See application file for complete search history.

(56) References Cited

U.S. PATENT DOCUMENTS

| | | | |
|---|---|---|---|
| 7,629,860 B2 | 12/2009 | Liu et al. | |
| 7,675,365 B2 | 3/2010 | Lee et al. | |
| 7,944,085 B2 | 5/2011 | Kyono | |
| 8,237,531 B2 | 8/2012 | Qiu et al. | |
| 8,339,203 B2 * | 12/2012 | Visser et al. | 330/301 |
| 8,803,526 B2 * | 8/2014 | Otake et al. | 324/322 |
| 2012/0326826 A1 | 12/2012 | Gertenbach et al. | |
| 2014/0320374 A1 * | 10/2014 | Lai et al. | 343/859 |

* cited by examiner

*Primary Examiner* — William Hernandez
(74) *Attorney, Agent, or Firm* — Mahamedi Paradice LLP

(57) ABSTRACT

A balun is disclosed that includes a main tank circuit, and at least one auxiliary tank circuit. The main tank circuit includes a primary winding and a secondary winding. The auxiliary tank circuit, which includes an auxiliary winding magnetically coupled to the primary and secondary windings and terminated in a capacitor, is electrically isolated from the main tank circuit and from an output port of the balun. The frequency responses of the main tank circuit and the auxiliary tank circuit may combine to result in a composite frequency response that is wider than the frequency response of the main tank circuit. The auxiliary tank circuit may be formed within an interior area of the primary and secondary windings of the main tank circuit.

18 Claims, 10 Drawing Sheets

MULTI-LOOP TRANSFORMER HAVING WIDEBAND FREQUENCY APPLICATIONS

TECHNICAL FIELD

The present embodiments relate generally to transformers, and specifically to baluns having wide frequency bandwidths.

BACKGROUND OF RELATED ART

Many communication devices include a balanced-to-unbalanced (balun) transformer to transform differential signals into single-ended signals, and/or to transform single-ended signals into differential signals. A balun typically includes two mutually coupled inductors (e.g., coils or windings) configured such that an input signal applied to the primary inductor induces an output voltage across the secondary inductor. In addition to transforming signals, baluns may also be used to provide impedance matching and filtering functions.

The quality factor (Q) of the balun may indicate the efficiency of energy transfer from the primary inductor to the secondary inductor. For example, a higher value of Q may indicate a higher voltage gain, higher energy transfer, and lower signal-to-noise ratio (SNR) for the balun, whereas a lower value of Q may indicate a lower voltage gain, lower energy transfer, and higher signal-to-noise ratio (SNR) for the balun.

As demands for higher bandwidth signal processing increases, so does the need for baluns to exhibit wider frequency bandwidths. The bandwidth of a balun may be increased by "de-Q'ing" the balun. For example, the Q of the balun may be decreased by providing a de-Q'ing resistor across the primary inductor, thereby widening the balun's frequency response (e.g., bandwidth) by increasing the balun's input impedance. Although effective in widening the frequency response of the balun, de-Q'ing the balun introduces unwanted losses, reduces gain, and may increase power consumption.

Thus, there is a need to widen the bandwidth of a balun without introducing additional losses, without reducing gain, and without increasing power consumption. In addition, it is desirable to achieve these goals without increasing circuit area of the balun and without increasing the complexity of associated control circuits and/or calibration circuits.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

A balun transformer is disclosed that may operate at wider bandwidths than similarly-sized conventional balun transformers without introducing any losses or other performance degradations. In accordance with the present embodiments, a balun is disclosed that includes an input port, an output port, a main tank circuit, and at least one auxiliary tank circuit. The input port is to receive an input signal, and the output port is to provide an output signal generated in response to the input signal. The main tank circuit includes a primary winding coupled to the input port, and a secondary winding coupled to the output port. The auxiliary tank circuit includes an auxiliary winding magnetically coupled to the primary winding and to the secondary winding. The auxiliary winding is terminated in a termination capacitor coupled in parallel with the auxiliary winding. In this manner, the auxiliary tank circuit is electrically isolated from the main tank circuit and electrically isolated from the output port.

The main tank circuit is to resonate at a first frequency and has a first frequency response. The auxiliary tank circuit is to resonate at a second frequency different from the first frequency, and has a second frequency response. The frequency responses of the main tank circuit and the auxiliary tank circuit may combine to result in a composite frequency response that is wider than the frequency response of the main tank circuit. In this manner, the addition of the auxiliary tank circuit(s) may widen the bandwidth of the balun without reducing the Q of the balun, and therefore without introducing additional losses and/or without reducing gain.

For some embodiments, the auxiliary tank circuit may be added to the main tank circuit without consuming additional circuit area, for example, by forming the auxiliary tank circuit(s) within an interior area of the primary and secondary windings of the main tank circuit. More specifically, the primary winding and the secondary winding may be a first coil and a second coil, respectively, that are physically interleaved with each other to form a loop. The auxiliary winding may be a third coil that lies within an interior area of the loop. The termination capacitor may also be formed within the interior area of the loop. Thus, for at least some embodiments, the auxiliary tank circuit(s) may be formed within the interior area of the loop formed by the interleaved primary and secondary windings of the main tank circuit.

BRIEF DESCRIPTION OF THE DRAWINGS

The present embodiments are illustrated by way of example and are not intended to be limited by the figures of the accompanying drawings, where.

Like reference numerals refer to corresponding parts throughout the drawing figures.

DETAILED DESCRIPTION

Figure 1A:
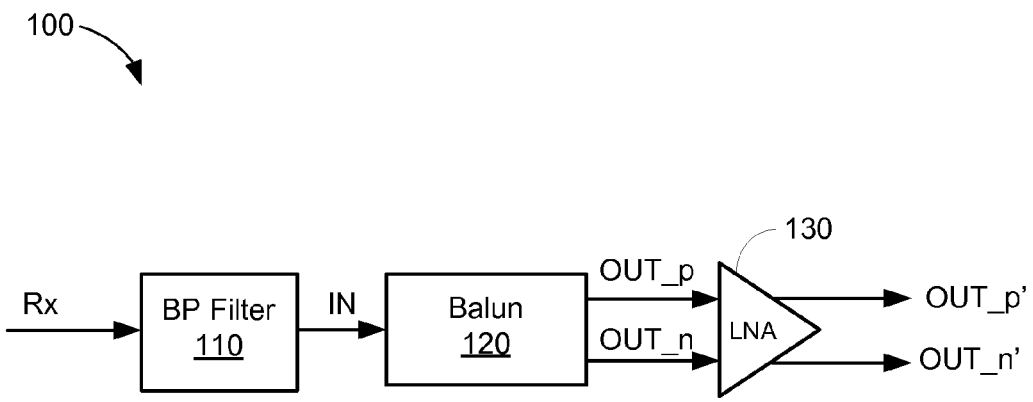
FIG. 1A is a block diagram of a receiver front-end circuit including a balun.

The present embodiments are described below in the context of balun transformers for simplicity only. It is to be understood that the present embodiments are equally applicable for other types of transformers, and/or for other devices that employ multiple resonant circuits. Further, although some embodiments may be discussed below in the context of front-end circuits employing low noise amplifiers, the present embodiments are equally applicable for front-end circuits employing other components such as, for example, variable-gain amplifiers, power amplifiers, filters, and mixers. In addition, the present embodiments may be employed within one or more low noise amplifiers, variable-gain amplifiers, power amplifiers, filters, and/or mixers. As used herein, the term "inductor" may refer to inductive elements formed by a wire, a coil, a winding, and/or conductive traces formed on a silicon chip. Thus, the terms "inductor," "coil," and "winding" may be used interchangeably herein. Further, as used herein, the terms "resonant circuit" and "tank circuit" may refer to circuits that resonate at a certain frequency (e.g., the resonant frequency), and thus the terms "resonant circuit" and "tank circuit" may be used interchangeably herein.

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components.

As mentioned above, many communication devices include a balun to transform differential signals into single-ended signals, and/or to transform single-ended signals into differential signals. More specifically, these baluns may be provided within the front-end circuits of such communication devices. For one example, transmitter front-end circuits coupled between a baseband processor and a transmitter may include digital-to-analog circuits (DACs), filters, mixers, variable-gain amplifiers (VGAs), and power amplifiers (PAs). For another example, receiver front-end circuits coupled between a receiver and the baseband processor may include low noise amplifiers (LNAs), variable-gain amplifiers (VGAs), mixers, filters, and analog-to-digital circuits (ADCs). Baluns provided within transmitter front-end circuits may be used to convert differential signals received from the PAs to a single-ended signal suitable for transmission over a communication medium (e.g., Ethernet cable, coax cable, wireless medium, and so on), while baluns provided within receiver front-end circuits may be used to convert a single-ended signal received from the communication medium into a differential signal for the LNA and/or VGA. Baluns may also provide impedance matching and filtering functions.

FIG. 1A shows a receiver front-end circuit 100 including a bandpass (BP) filter 110, a balun 120, and an LNA 130. Filter 110 receives an RF input signal Rx, and provides a filtered input signal IN to balun 120. In response thereto, balun 120 transforms the input signal IN into a differential signal OUT_p/OUT_n. The LNA 130 amplifies the differential signal OUT_p/OUT_n to generate an amplified differential signal OUT_p'/OUT_n'.

Figure 1B:
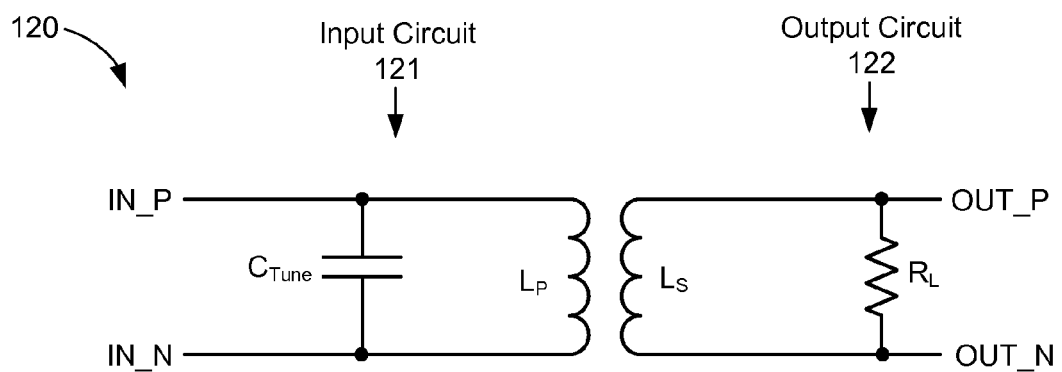
FIG. 1B is a circuit diagram of the balun of FIG. 1A.
Figure 1C:
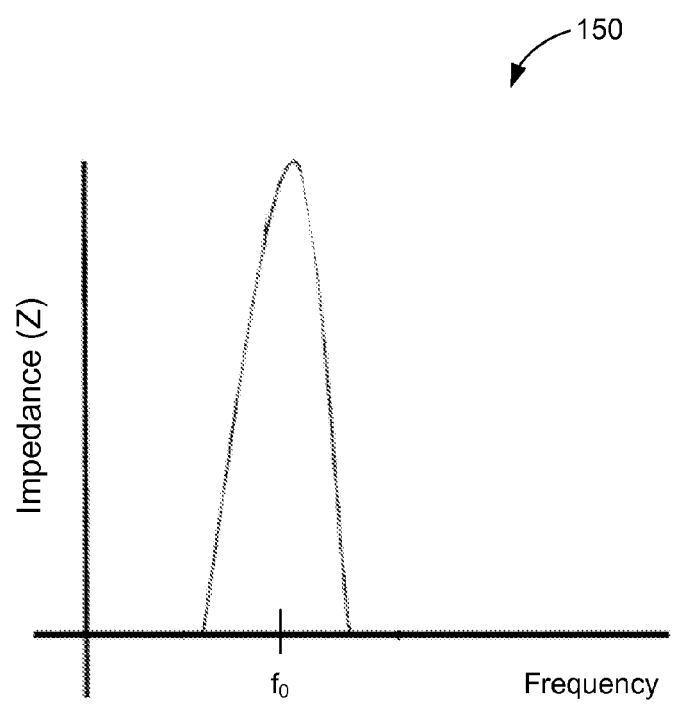
FIG. 1C is an exemplary graph depicting a frequency response of the balun of FIG. 1B.

FIG. 1B is an exemplary circuit diagram of the balun 120 of FIG. 1A. Balun 120 is shown to include an input circuit 121 and an output circuit 122. The input circuit 121 includes input terminals IN_P and IN_N, a primary inductor $L_P$, and a tuning capacitor $C_{TUNE}$. Input terminals IN_P and IN_N may receive an input signal. The tuning capacitor $C_{TUNE}$ and the primary inductor $L_P$ are coupled in parallel across the input terminals IN_P and IN_N.

The output circuit 122 includes output terminals OUT_P and OUT_N, a secondary inductor $L_S$, and a load resistor $R_L$. Output terminals OUT_P and OUT_N may provide an output signal that is generated in response to the input signal provided to the input circuit 121. The load resistor $R_L$, which may model a load coupled to the output circuit 122, is coupled in parallel across the secondary inductor $L_S$.

The primary and secondary inductors $L_P$ and $L_S$ are magnetically coupled to each other, and together form a transformer that may transform the input signal to generate the output signal. The amount of magnetic coupling between the primary and secondary inductors $L_P$ and $L_S$ may be represented by a coupling coefficient k, where $0 \le k \le 1$. The value of the coupling coefficient k may be proportional to frequency. The balun 120 forms a resonant circuit that may resonate at a frequency known as its resonant frequency ($f_0$). The angular resonant frequency may be expressed as $\omega_0 = 2\pi f_0$. The resonant frequency $f_0$, may be determined, in part, by the capacitance value of $C_{TUNE}$, the inductance values of $L_P$ and $L_S$, and/or the respective impedances of the input circuit 121 and the output circuit 122. The bandwidth of the balun 120 may be expressed as $$BW = \frac{\omega_{center}}{2\omega_{3dB}},$$

where $\omega_{center}$ is the center frequency and $\omega_{3dB}$ is the frequency at the 3 dB point.

FIG. 10 is a graph depicting a frequency response 150 of the balun 120, where frequency is represented on the x-axis and input impedance (Z) is represented on the y-axis. Note that the value of the impedance Z is greatest (e.g., at a maximum value) when the frequency of the input signal is equal to the resonant frequency $f_0$.

It may be desirable to increase the bandwidth (e.g., to widen the frequency response 150) of balun 120, for example, so that the front-end circuit 100 of FIG. 1A may process input signals having a greater range of frequencies. As mentioned above, the bandwidth of balun 120 may be increased by reducing the Q of its resonant circuit (e.g., by coupling a de-Q'ing resistor across the primary winding $L_P$). However, reducing the Q of the resonant circuit increases losses across the transformer, decreases the gain of the transformer, and may increase power consumption of balun 120. In addition, because de-Q'ing the resonant circuit typically widens the frequency response 150 (e.g., depicted in FIG. 10) by pushing the 3 dB points away from the resonant frequency, the resulting widened frequency response may include one or more ripples that degrade the "flatness" of the frequency response.

Thus, in accordance with the present embodiments, one or more additional resonant circuits may be associated with a balun to increase its bandwidth. These additional resonant circuits, which are referred to below as auxiliary tank circuits, may resonant at frequencies different from each other and/or different from the resonant frequency of the balun's main resonant circuit. Each of the auxiliary tank circuits may exhibit its own frequency response that, when superimposed with each other and the frequency response of the balun's main resonant circuit, may result in a composite frequency response that is wider than the frequency response of the original balun. In this manner, the addition of the auxiliary tank circuits may widen the bandwidth of the balun without reducing the Q of the balun, and therefore without introducing additional losses and/or without reducing gain.

Figure 2A:
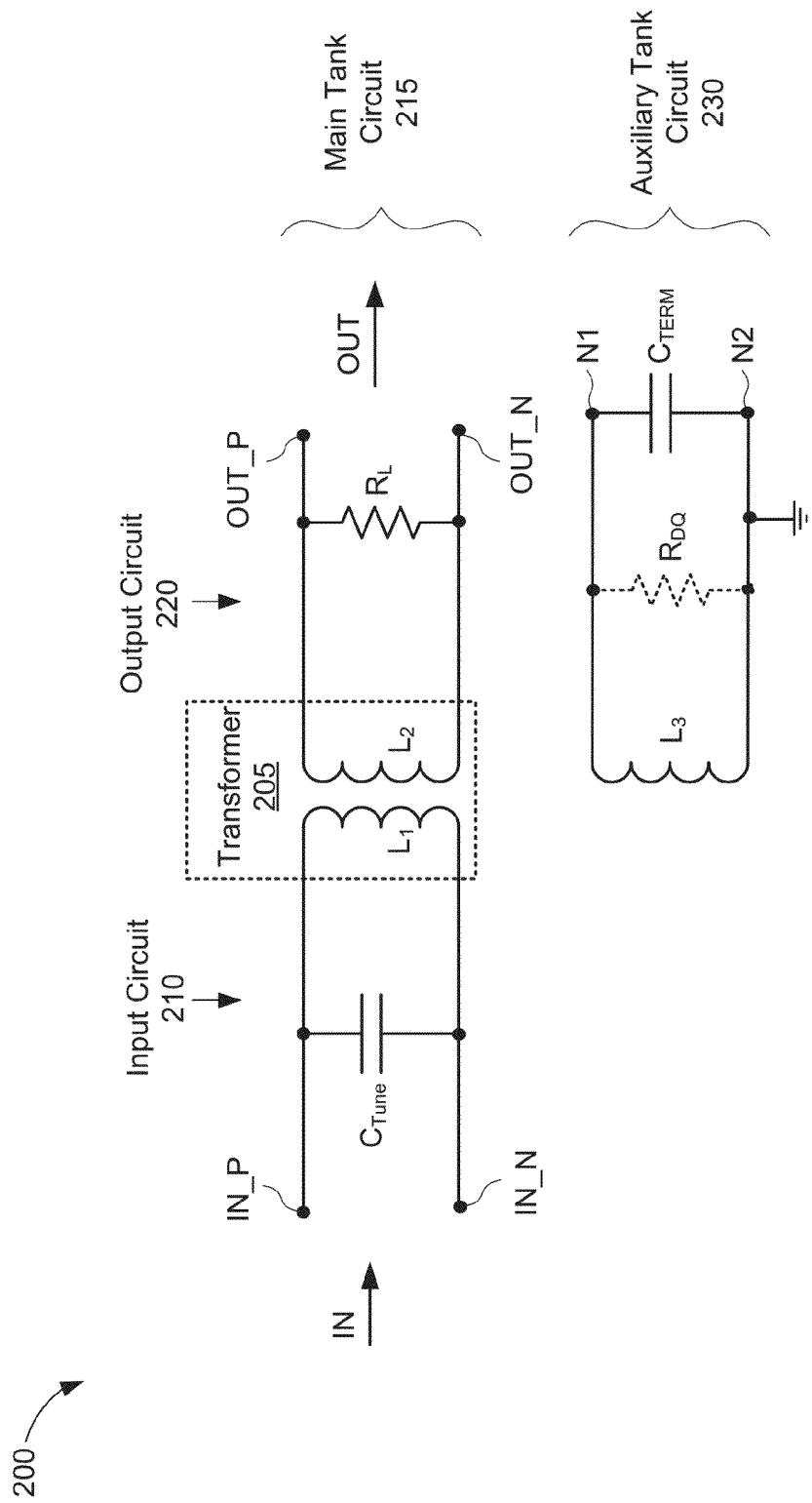
FIG. 2A is a circuit diagram of a balun in accordance with some embodiments.

FIG. 2A shows a circuit diagram of a balun 200 in accordance with the present embodiments. Balun 200 includes an input circuit 210, an output circuit 220, and an auxiliary tank circuit 230. The input circuit 210 includes input terminals IN_P and IN_N, a primary inductor or winding $L_1$, and a tuning capacitor $C_{TUNE}$. Input terminals IN_P and IN_N may receive an input signal (IN). For embodiments in which the input signal IN is a single-ended signal (e.g., the input signal Rx provided by filter 110 of FIG. 1A), one of the input terminals IN_P or IN_N may be coupled to ground potential, and/or a well-known center tap (not shown for simplicity) may be provided for the secondary winding $L_2$. For embodiments in which the output signal OUT is a single-ended signal (and the input signal IN is a differential signal), one of the output terminals OUT_P or OUT_N may be coupled to ground potential, and/or a well-known center tap (not shown for simplicity) may be provided for the primary winding $L_1$. The tuning capacitor $C_{TUNE}$ and the primary winding $L_1$ are coupled in parallel across the input terminals IN_P and IN_N. The tuning capacitor $C_{TUNE}$ may be used to adjust a resonant frequency of the balun 120.

The output circuit 220 includes output terminals OUT_P and OUT_N, a secondary winding $L_2$, and a load resistor $R_L$. Output terminals OUT_P and OUT_N may provide an output signal (OUT) that is generated in response to the input signal IN. The load resistor $R_L$, which may model a load coupled to the output circuit 220, is coupled in parallel across the secondary winding $L_2$.

Figure 2B:
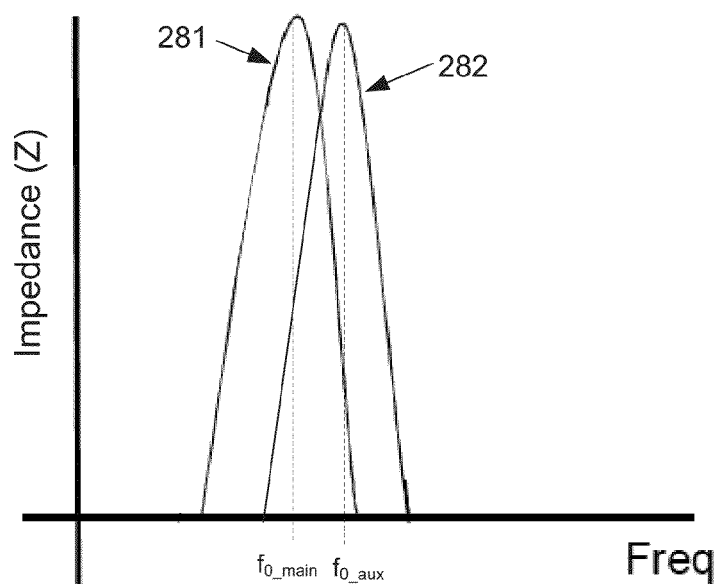
FIG. 2B is an illustrative graph depicting exemplary frequency responses of the main tank circuit and the auxiliary tank circuit of the balun of FIG. 2A.

The primary and secondary windings $L_1$ and $L_2$ are magnetically coupled to each other, and together form a transformer 205 that may transform the input signal IN to generate the output signal OUT. The amount of magnetic coupling between the primary and secondary windings $L_1$ and $L_2$ may be represented by a first coupling coefficient $k_1$. The mutual inductance between the primary and secondary windings $L_1$ and $L_2$ may be represented as $M_{12}=k_1\sqrt{L_1L_2}$. The input and output circuits 210 and 220 together form a main tank circuit 215 that may resonate at a main resonant frequency $f_{0\_main}$. The main tank circuit 215 has a frequency response, for example, such as the exemplary frequency response 281 depicted in FIG. 2B.

The auxiliary tank circuit 230 includes an auxiliary winding $L_3$ and a termination capacitor $C_{TERM}$, which are coupled in parallel with each other between nodes N1 and N2. Node N2 is connected to ground potential. Node N1 is not connected to any circuit elements, voltage supplies, or input/output terminals. Thus, the auxiliary tank circuit 230 is electrically isolated from the main tank circuit 215, and is electrically isolated from the balun 200's output port formed by output terminals OUT_P and OUT_N. As described in more detail below, the auxiliary winding $L_3$ is terminated in the termination capacitor $C_{TERM}$, and is therefore not electrically connected to any portion of main tank circuit 215.

The auxiliary winding $L_3$ is magnetically coupled to both the primary winding $L_1$ and the secondary winding $L_2$. The amount of magnetic coupling between the windings $L_1/L_2$ of the main transformer 205 and the auxiliary winding $L_3$ of the auxiliary tank circuit 230 may be represented by a second coupling coefficient $k_2$. The mutual inductance between the primary winding $L_1$ and the auxiliary winding $L_3$ may be represented as $M_{13}=k_2\sqrt{L_1L_3}$, and the mutual inductance between the secondary winding $L_2$ and the auxiliary winding $L_3$ may be represented as $M_{23}=k_2\sqrt{L_2L_3}$ (assuming the coupling coefficient between windings $L_1$ and $L_3$ is the same as the coupling coefficient between windings $L_2$ and $L_3$). The auxiliary tank circuit 230 may resonate at an auxiliary resonant frequency $f_{0\_aux}$. The auxiliary tank circuit 230 has a frequency response, for example, such as the exemplary frequency response 282 depicted in FIG. 2B.

Figure 2C:
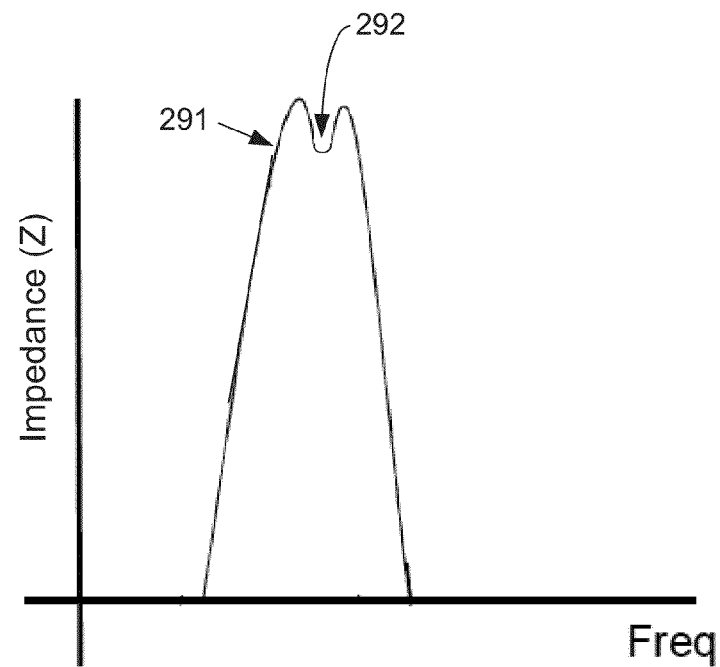
FIG. 2C is an illustrative graph depicting an exemplary composite frequency response of the balun of FIG. 2A.

In accordance with the present embodiments, the primary and secondary windings $L_1$ and $L_2$ are tightly coupled together so that their coupling coefficient $k_1$ is relatively high, while the windings $L_1/L_2$ of the main transformer 205 and the auxiliary winding $L_3$ are loosely coupled together so that their coupling coefficient $k_2$ is relatively low. For an exemplary embodiment, the first coupling coefficient $k_1$ is approximately 0.9, and the second coupling coefficient $k_2$ is approximately 0.15 (although other suitable values for $k_1$ and $k_2$ may be used). Because the value of the second coupling coefficient $k_2$ is relatively small (e.g., compared with the value of the first coupling coefficient $k_1$), the respective frequency responses 281 and 282 of the main tank circuit 215 and the auxiliary tank circuit 230 may converge so that the resulting "composite" frequency response of the balun 200 appears as a single frequency response 291, as depicted in FIG. 2C. Note that the "composite" frequency response 291 of the balun 200 has a wider bandwidth than the frequency response 281 of the main tank circuit 215.

Accordingly, associating the auxiliary tank circuit 230 with the main tank circuit 215 may widen the bandwidth of the balun 200 without reducing the Q of the main tank circuit 215 (e.g., using conventional de-Q'ing techniques), thereby improving the frequency response of the balun 200 (e.g., compared with balun 120) without introducing losses or reducing the gain of the main transformer 205. In other words, by "adding" the frequency response 282 of the auxiliary tank circuit 230 to the frequency response 281 of the main tank circuit 215 to produce the composite frequency response 291, the first coupling coefficient $k_1$ between the primary and secondary windings $L_1$ and $L_2$ may remain at a relatively high value (e.g., $k_1 \approx 0.9$), which in turn avoids losses associated with adding a de-Q'ing resistor to the main tank circuit 215.

The ripple 292 in the composite frequency response 291 of the balun 200 may be reduced to "flatten" the composite frequency response 291. For at least some embodiments, a de-Q'ing resistor $R_{DQ}$ may be coupled across the auxiliary winding $L_3$ of the auxiliary tank circuit 230 to flatten the composite frequency response 291 (as depicted in FIG. 2A). For some embodiments, the resistance value of the de-Q'ing resistor $R_{DQ}$ may be dynamically adjusted, for example, by a control circuit (not shown for simplicity) that is responsive to a center frequency of the input signal IN (or other information indicate of frequency). Because the values of the coupling coefficients $k_1$ and $k_2$ are proportional to frequency, the separation of respective frequency responses 281 and 282 of main tank circuit 215 and auxiliary tank circuit 230 may increase in response to increases in frequency (e.g., thereby exacerbating the ripple 292 in the composite frequency response 291). Increases in values of $k_1$ and $k_2$ resulting from increases in frequency may be compensated by the RC circuit formed by the de-Q'ing resistor $R_{DQ}$ and the termination capacitor $C_{TERM}$ of the auxiliary tank circuit 230. Similarly, decreases in values of $k_1$ and $k_2$ resulting from decreases in frequency may be compensated by the RC circuit. In this manner, the composite frequency response 291 of the balun 200 may remain substantially constant over a wide range of frequencies, for example, by selectively adjusting the value of the de-Q'ing resistor $R_{DQ}$ in response to changes in frequency.

Note that addition of the de-Q'ing resistor $R_{DQ}$ to the auxiliary tank circuit 230 does not introduce any losses or reduce the gain of the balun 200 because (1) the auxiliary winding $L_3$ is terminated in the termination capacitor $C_{TERM}$ and (2) the auxiliary tank circuit 230 is not electrically coupled to either the main tank circuit 215 or the output port formed by output terminals OUT_P/OUT_N.

Further, because the auxiliary winding $L_3$ is terminated in the termination capacitor $C_{TERM}$ (e.g., rather than electrically connected to either of the output terminals OUT_P/OUT_N of the balun 200), the relatively low value of the second coupling coefficient $k_2$ between the windings $L_1/L_2$ of the main tank circuit 215 and the winding $L_3$ of the auxiliary tank circuit 230 may not introduce any losses or reduce gain of the balun 200. In this manner, the value of the second coupling coefficient $k_2$ may remain at a sufficiently low value that causes the respective frequency responses 281 and 282 of the main tank circuit 215 and the auxiliary tank circuit 230 to converge in a manner that produces the composite frequency response 291, as depicted in FIG. 2C.

Figure 3A:
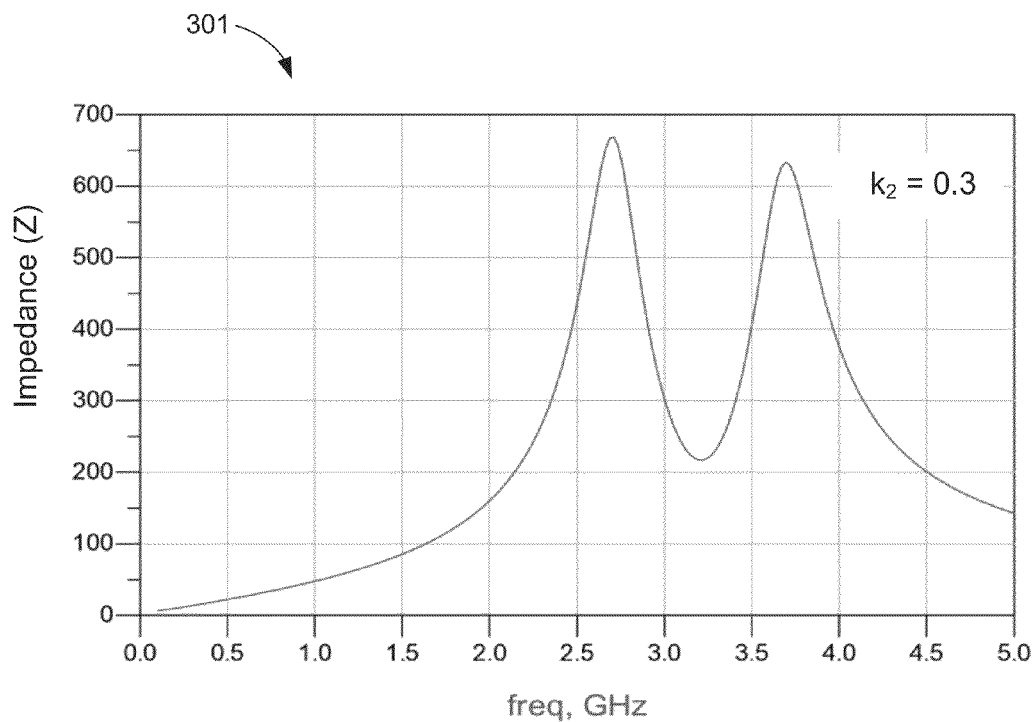
FIGS. 3A-3C illustrate changes in the relative frequency responses of the main tank circuit and the auxiliary tank circuit of the balun of FIG. 2A resulting from different values of the coupling coefficient.
Figure 3B:
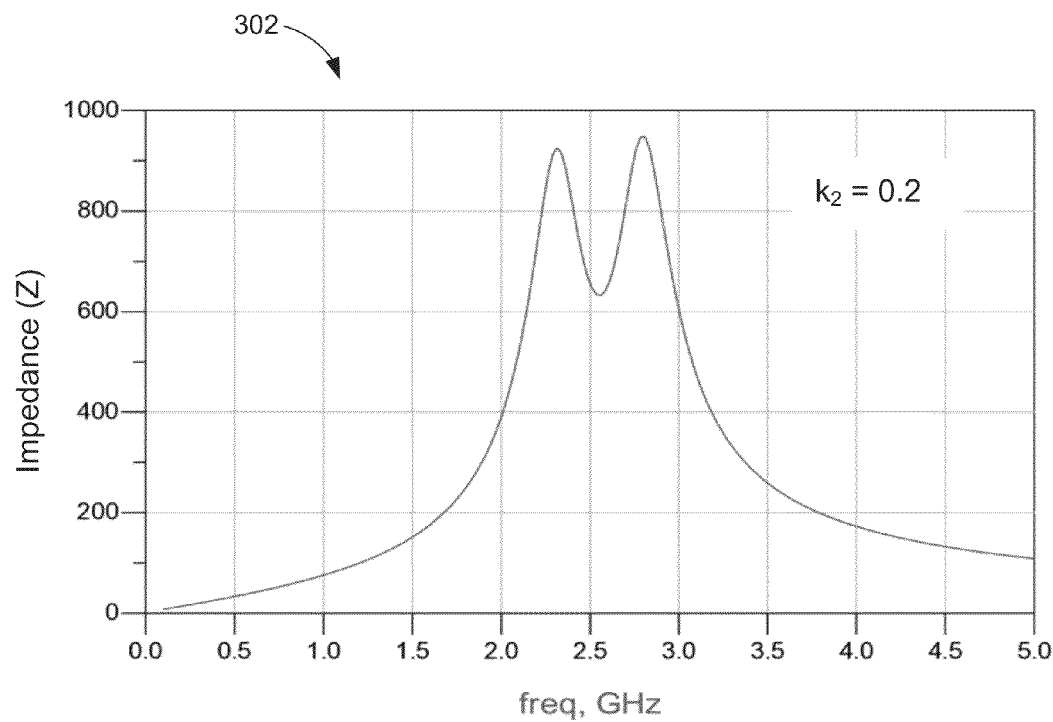
Figure 3C:
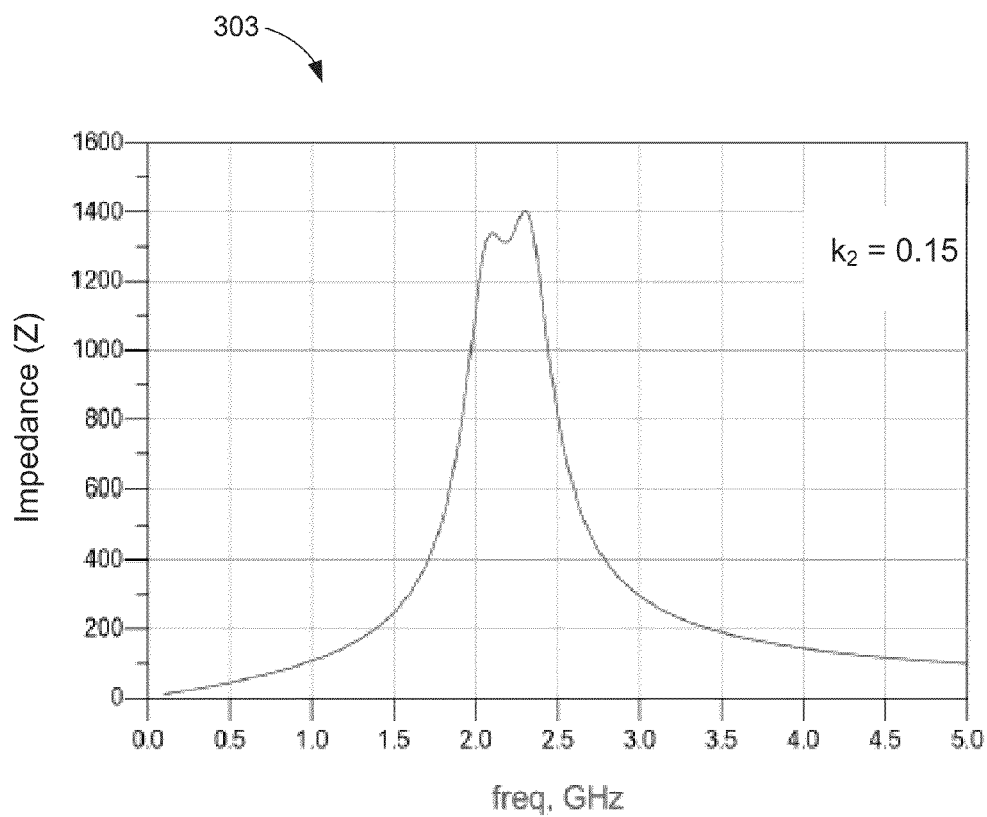

As mentioned above, increasing the value of the second coupling coefficient $k_2$ may cause the respective frequency responses 281 and 282 to separate from each other, which in turn may increase the size of the ripple 292 within the resulting composite frequency response 291 of the balun 200. For example, FIG. 3A shows an exemplary composite frequency response 301 of the balun 200 for $k_2=0.3$, FIG. 3B shows an exemplary composite frequency response 302 of the balun 200 for $k_2=0.2$, and FIG. 3C shows an exemplary composite frequency response 303 of the balun 200 for $k_2=0.15$. Thus, reducing the value of the second coupling coefficient $k_2$ may flatten the composite frequency response of the balun 200.

Figure 2D:
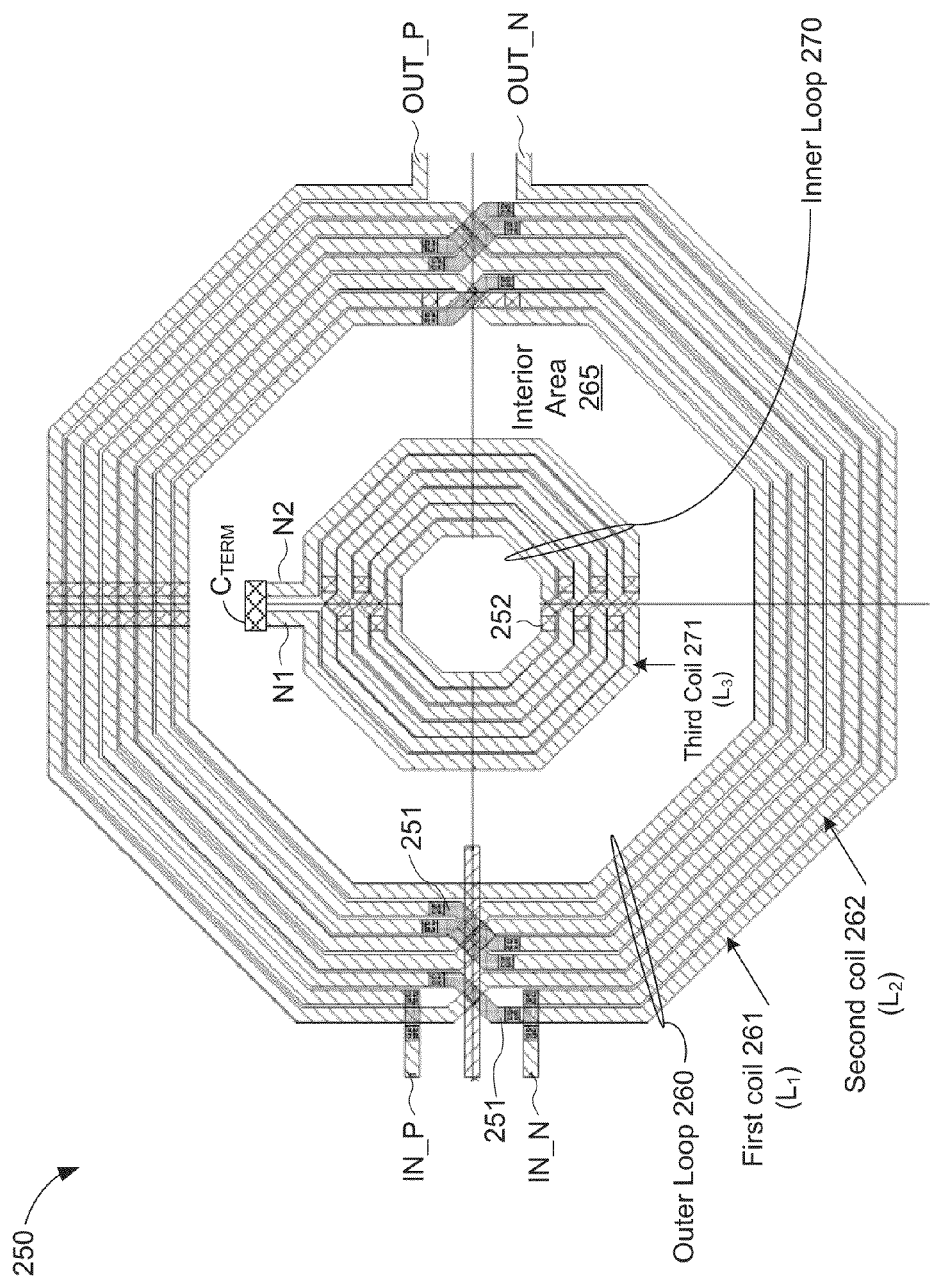
FIG. 2D is a top plan view of the transformer and auxiliary tank circuit of the balun of FIG. 2A in accordance with some embodiments.

Referring again to FIG. 2A, the auxiliary tank circuit 230 may be added to the main tank circuit 215 (e.g., to form the balun 200) without consuming additional circuit area. In accordance with the present embodiments, the auxiliary tank circuit 230 may be formed within an interior area of the primary and secondary windings $L_1$ and $L_2$ of the main tank circuit 215. For example, FIG. 2D shows a top plan view of a portion 250 of the balun 200 of FIG. 2A. Portion 250, which may be formed on a silicon substrate (not shown for simplicity), is shown to include an outer loop 260 and an inner loop 270. For some embodiments, the outer loop 260 and the inner loop 270 are substantially co-planer conductive traces (e.g., polysilicon or other suitable conductive material) formed on the silicon substrate.

The outer loop 260 includes a first coil 261 physically interleaved with a second coil 262. The first coil 261, which is one embodiment of the primary winding $L_1$ of the balun 200 (FIG. 2A), is coupled to input terminals IN_P and IN_N. The second coil 262, which is one embodiment of the secondary winding $L_2$ of the balun 200, is coupled to output terminals OUT_P and OUT_N. The outer loop 260 may include cross-over portions 251 that allow the first and second coils 261 and 262 to be interleaved with one another. The first and second coils 261 and 262 may include any suitable number of turns. Thus, although FIG. 2D may depict the first and second coils 261 and 262 as having a similar number of turns, for other embodiments, the first and second coils 261 and 262 may include different numbers of turns (e.g., to transform voltage levels across the transformer 205 formed by the primary and secondary windings $L_1$ and $L_2$).

The inner loop 270 includes a third coil 271 that lies entirely within an interior area 265 of the outer loop 260. The third coil 271, which is one embodiment of the auxiliary winding $L_3$ of the balun 200 (FIG. 2A), is terminated in the termination capacitor $C_{TERM}$ at nodes N1 and N2. Thus, for the exemplary embodiment shown in FIG. 2D, the termination capacitor $C_{TERM}$ is also formed within the interior area 265 of the outer loop 260. For such embodiments, the auxiliary tank circuit 230 of FIG. 2A may be formed within the interior area 265 of the interleaved primary and secondary windings $L_1$ and $L_2$ of the main tank circuit 215, and therefore the addition of the auxiliary tank circuit 230 to the main tank circuit 215 does not consume any additional circuit area. The inner loop 270 may include cross-over portions 252 that allow the third coil 271 to be interleaved with itself (or another coil associated with another auxiliary tank circuit). The third coil 271 may include any suitable number of turns. For other embodiments, the termination capacitor $C_{TERM}$ may be formed outside of the outer loop 260.

As described above with respect to FIG. 2A, the first and second coils 261 and 262 are tightly coupled together so that their coupling factor $k_1$ is relatively high (e.g., $k_1 \approx 0.9$), and the third coil 271 of the inner loop 270 is loosely coupled with the first and second coils 261 and 262 of the outer loop 260 so that their coupling factor $k_2$ is relatively low (e.g., $k_2 \approx 0.15$). In this manner, the overall frequency response of the balun 200, including portion 250 of FIG. 2D, may be widened (e.g., as compared with balun 120 of FIG. 1B) without increasing circuit area, without reducing the Q of the main tank circuit 215, and without reducing the gain of transformer 205.

Figure 4A:
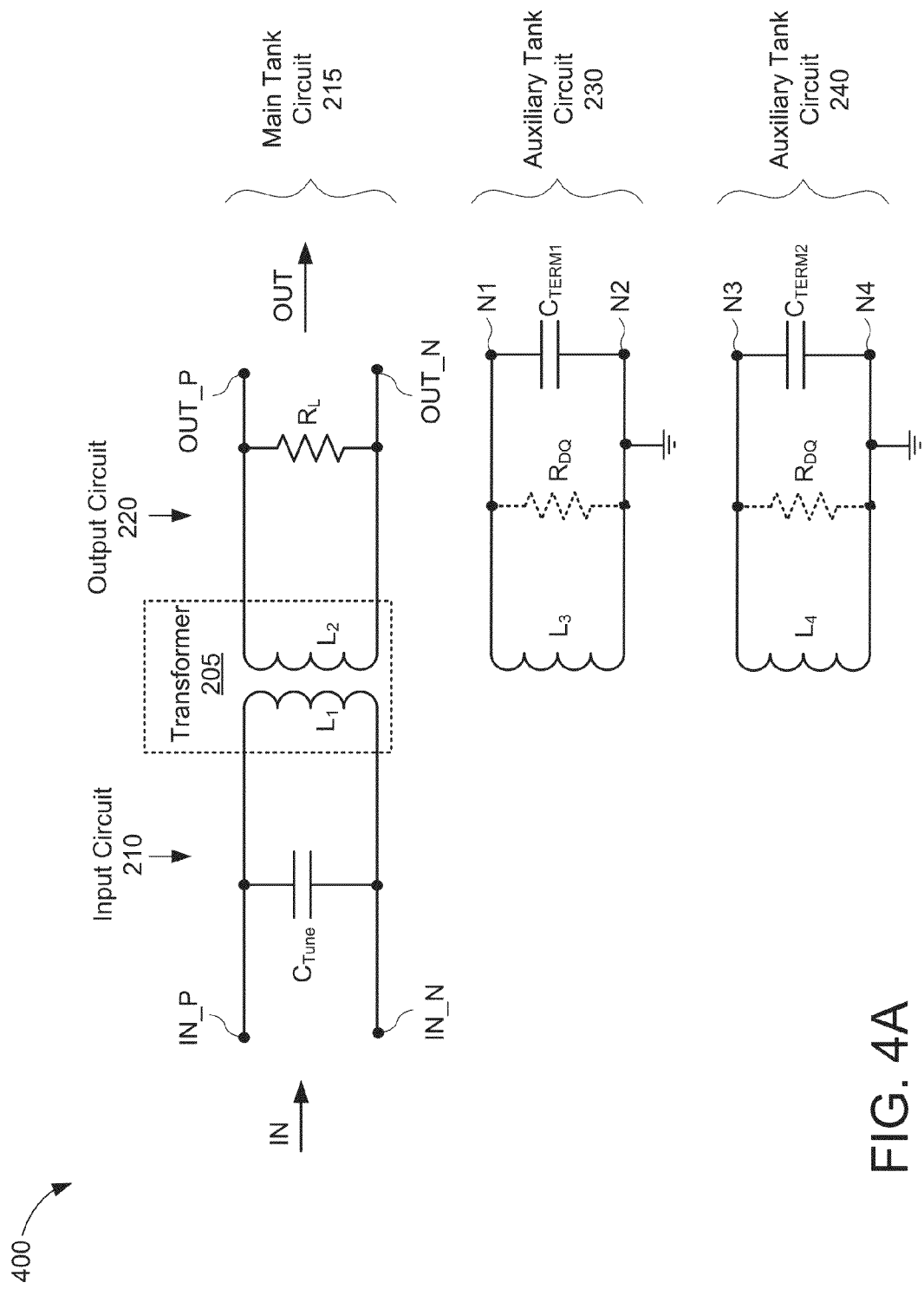
FIG. 4A is a circuit diagram of a balun in accordance with other embodiments.

For other embodiments, a plurality of auxiliary tank circuits 230 may be associated with the main tank circuit 215 of balun 200, for example, to achieve even wider frequency responses (e.g., wider than frequency response 291 of FIG. 2C). For example, FIG. 4A shows a balun 400 in accordance with other embodiments. Balun 400, which includes all the elements of balun 200 of FIG. 2A, also includes a second auxiliary tank circuit 240. The second auxiliary tank circuit 240 includes a second auxiliary winding $L_4$ and a second termination capacitor $C_{TERM2}$, which are coupled in parallel with each other between nodes N3 and N4. Node N4 is connected to ground potential. Node N3 is not connected to any circuit elements, voltage supplies, or input/output terminals. Thus, the second auxiliary tank circuit 240 is electrically isolated from the main tank circuit 215, and is electrically isolated from the balun 400's output port formed by output terminals OUT_P and OUT_N. In addition, the second auxiliary tank circuit 240 is electrically isolated from the first auxiliary tank circuit 230. The second auxiliary winding $L_4$ is terminated in the second termination capacitor $C_{TERM2}$, and is therefore not electrically connected to any portion of main tank circuit 215.

The second auxiliary winding $L_4$ is magnetically coupled to both the primary winding $L_1$ and the secondary winding $L_2$. The amount of magnetic coupling between the windings $L_1/L_2$ of the main transformer 205 and the auxiliary winding $L_4$ of the second auxiliary tank circuit 240 may be represented by a third coupling coefficient $k_3$. For at least some embodiments, the second coupling coefficient $k_2$ may be substantially equal to the third coupling coefficient $k_3$. The mutual inductance between the primary winding $L_1$ and the second auxiliary winding $L_4$ may be represented as $M_{13}=k_3\sqrt{L_1L_4}$, and the mutual inductance between the secondary winding $L_2$ and the second auxiliary winding $L_4$ may be represented as $M_{24}=k_3\sqrt{L_1L_3}$ (assuming the coupling coefficient between windings $L_1$ and $L_4$ is the same as the coupling coefficient between windings $L_2$ and $L_4$). Further, the second auxiliary winding $L_4$ may be magnetically coupled to the first auxiliary winding $L_3$ (and thus there may be mutual inductance between the two auxiliary windings $L_3$ and $L_4$).

Figure 4B:
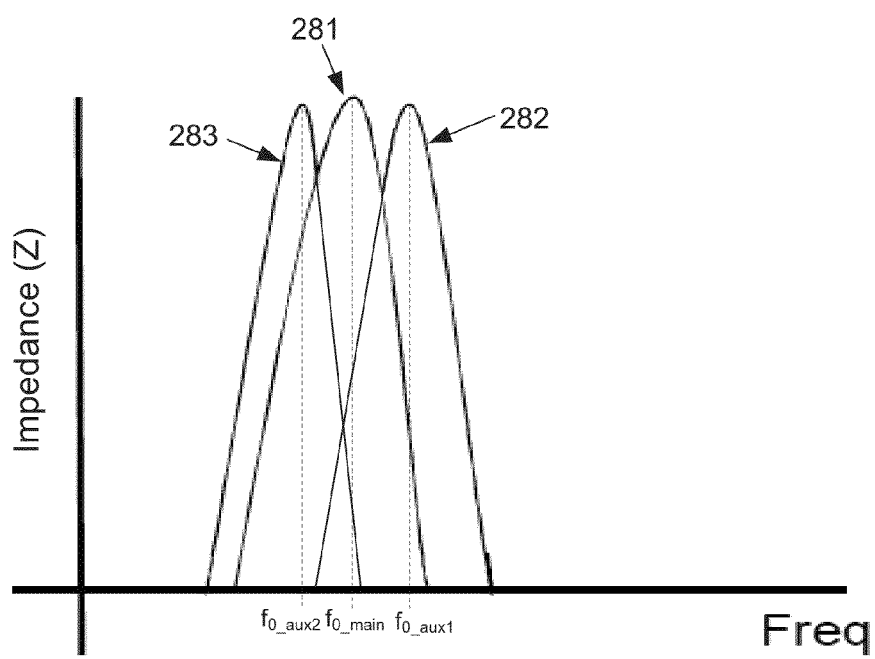
FIG. 4B is an illustrative graph depicting exemplary frequency responses of the main tank circuit and the auxiliary tank circuits of the balun of FIG. 4A.

The main tank circuit 215 may resonate at a main resonant frequency $f_{0\_main}$, and has a frequency response, for example, such as the exemplary frequency response 281 depicted in FIG. 4B. The first auxiliary tank circuit 230 may resonate at a first auxiliary resonant frequency $f_{0\_aux1}$, and has a frequency response, for example, such as the exemplary frequency response 282 depicted in FIG. 4B. The second auxiliary tank circuit 240 may resonate at a second auxiliary resonant frequency $f_{0\_aux2}$, and has a frequency response, for example, such as the exemplary frequency response 283 depicted in FIG. 4B.

Figure 4C:
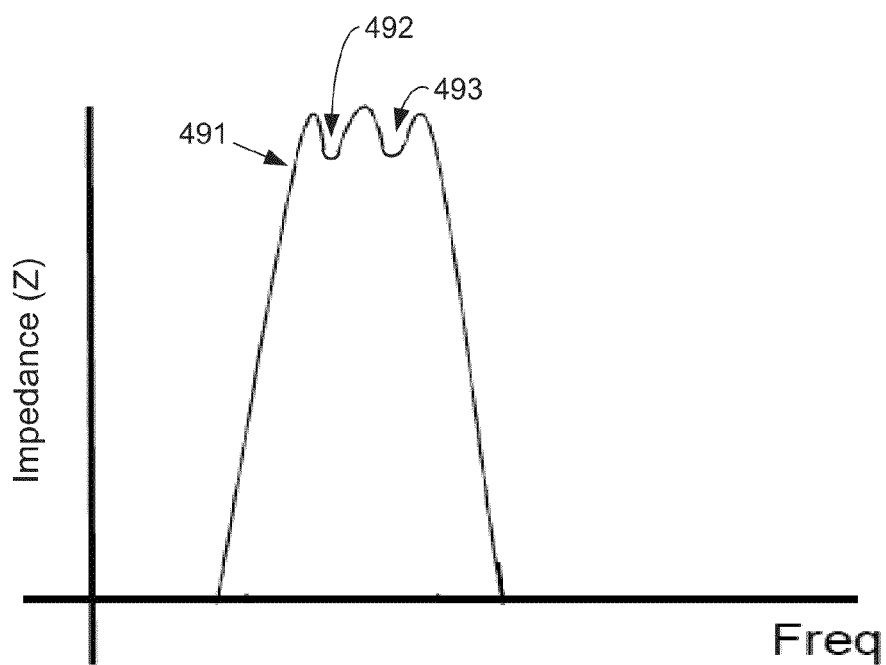
FIG. 4C is an illustrative graph depicting an exemplary composite frequency response of the balun of FIG. 4A.

In accordance with the present embodiments, the primary and secondary windings $L_1$ and $L_2$ are tightly coupled together so that their coupling coefficient $k_1$ is relatively high, while the windings $L_1/L_2$ of the main transformer 205 and the first auxiliary winding $L_3$ are loosely coupled together so that their coupling coefficient $k_2$ is relatively low. Similarly, the windings $L_1/L_2$ of the main transformer 205 and the second auxiliary winding $L_4$ are loosely coupled together so that their coupling coefficient $k_3$ is relatively low. For an exemplary embodiment, the first coupling coefficient $k_1$ is approximately 0.9, and the second and third coupling coefficients $k_2$ and $k_3$ are approximately 0.15 (although other suitable values for $k_1$, $k_2$, and $k_3$ may be used). Because the values of the $k_2$ and $k_3$ are relatively small (e.g., compared with the value of the first coupling coefficient $k_1$), the respective frequency responses 281, 282, and 283 of the main tank circuit 215 and the auxiliary tank circuits 230 and 240 may converge so that the resulting composite frequency response of the balun 400 appears as a single frequency response 491, as depicted in FIG. 4C. Note that the composite frequency response 491 of the balun 400 has a wider bandwidth than the frequency response 281 of the main tank circuit 215.

Accordingly, associating both the first auxiliary tank circuit 230 and the second auxiliary tank circuit 240 with the main tank circuit 215 may further widen the bandwidth of the balun 400 (e.g., as compared to balun 200 of FIG. 2A) without reducing the Q of the main tank circuit 215, and therefore without introducing losses or reducing the gain of the main transformer 205. Thus, by adding the frequency response 282 of the first auxiliary tank circuit 230 and the frequency response 283 of the second auxiliary tank circuit 240 to the frequency response 281 of the main tank circuit 215 to produce the composite frequency response 491, the first coupling coefficient $k_1$ between the primary and secondary windings $L_1$ and $L_2$ may remain at a relatively high value (e.g., $k_1 \approx 0.9$), which in turn avoids losses associated with adding a de-Q'ing resistor to the main tank circuit 215.

The ripples 492-493 in the composite frequency response 491 of the balun 400 may be reduced to "flatten" the composite frequency response 491 by providing de-Q'ing resistors $R_{DQ}$ across the auxiliary windings $L_3$ and $L_4$ of the respective auxiliary tank circuits 230 and 240 to flatten the composite frequency response 491, for example, in a manner similar to that described above with respect to FIG. 2A.

Figure 4D:
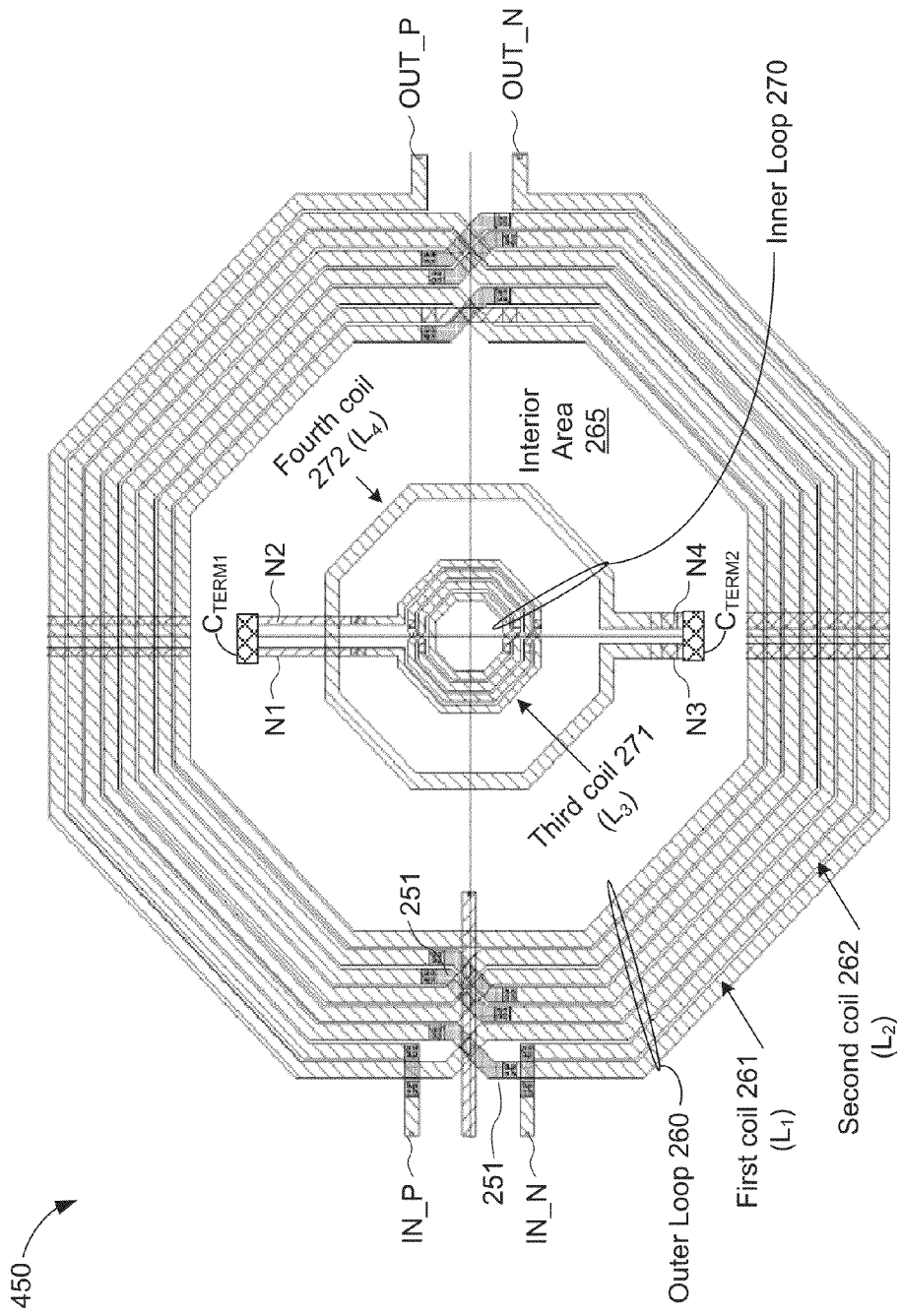
FIG. 4D is a top plan view of the transformer and auxiliary tank circuits of the balun of FIG. 4A in accordance with some embodiments.

Referring again to FIG. 4A, the first auxiliary tank circuit 230 and the second auxiliary tank circuit 240 may be added to the main tank circuit 215 (e.g., to form the balun 400) without consuming additional circuit area. For example, FIG. 4D shows a top plan view of a portion 450 of the balun 400 of FIG. 4A. Portion 450, which may be formed on a silicon substrate (not shown for simplicity), includes all the elements of portion 250 of FIG. 2A, and also includes a fourth coil 272 formed within the inner loop 270. The fourth coil 272, which is one embodiment of the second auxiliary winding $L_4$ of the balun 400 (FIG. 4A), is terminated in the second termination capacitor $C_{TERM2}$ at nodes N3 and N4. Thus, for the exemplary embodiment shown in FIG. 4D, the termination capacitor $C_{TERM2}$ is also formed within the interior area 265 of the outer loop 260. For such embodiments, the first and second auxiliary tank circuits 230 and 240 of FIG. 4A may be formed within the interior area 265 of the interleaved primary and secondary windings $L_1$ and $L_2$ of the main tank circuit 215, and therefore the addition of the first and second auxiliary tank circuits 230 and 240 to the main tank circuit 215 does not consume any additional circuit area. The inner loop 270 may include cross-over portions 252 that allow the third coil 271 to be interleaved with itself (or another coil associated with another auxiliary tank circuit). The fourth coil 272 may include any suitable number of turns. For other embodiments, the termination capacitors $C_{TERM1}$ and $C_{TERM2}$ may be formed outside of the outer loop 260.

In the foregoing specification, the present embodiments have been described with reference to specific exemplary embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense. For example, it is to be understood that the present embodiments may include any suitable number of auxiliary tank circuits associated with the main tank circuit 215, and that these auxiliary tank circuits may be formed within an interior area of the outer loop formed by the interleaved primary and second windings $L_1$ and $L_2$ of the main tank circuit 215.

What is claimed is:

1. A balun device, comprising:
   an input port to receive an input signal;
   an output port to provide an output signal;
   a main tank circuit, including:
      a primary winding coupled to the input port; and
      a secondary winding coupled to the output port;
   and
   an auxiliary tank circuit, electrically isolated from the main tank circuit and electrically isolated from the output port, including:
      an auxiliary winding magnetically coupled to the primary winding and to the secondary winding; and
      a termination capacitor coupled in parallel with the auxiliary winding;
   wherein the primary winding and the secondary winding are interleaved with each other to form a loop; and
   the auxiliary tank circuit is formed within an interior area of the loop.

2. The balun device of claim 1, wherein the main tank circuit is to resonate at a first frequency, and the auxiliary tank circuit is to resonate at a second frequency different from the first frequency.

3. The balun device of claim 1, wherein the output signal is responsive, at least in part, to a resonance of the auxiliary tank circuit.

4. The balun device of claim 1, wherein a frequency response of the balun device comprises a combination of a resonance of the main tank circuit and a resonance of the auxiliary tank circuit.

5. A balun device, comprising:
an input port to receive an input signal;
an output port to provide an output signal;
a main tank circuit, including:
   a primary winding coupled to the input port; and
   a secondary winding coupled to the output port;
and
an auxiliary tank circuit, electrically isolated from the main tank circuit and electrically isolated from the output port, including:
   an auxiliary winding magnetically coupled to the primary winding and to the secondary winding; and
   a termination capacitor coupled in parallel with the auxiliary winding;
wherein:
the primary winding and the secondary winding comprise a first coil and a second coil, respectively, and the first and second coils are physically interleaved with each other to form a loop; and
the auxiliary winding comprises a third coil that lies within an interior area of the loop, and the third coil includes first and second ends terminated in the termination capacitor.

6. The balun device of claim 5, wherein the termination capacitor lies within the interior area of the loop.

7. The balun device of claim 5, wherein the first coil, the second coil, and the third coil comprise co-planar conductive traces.

8. A balun device, comprising
an input port to receive an input signal;
an output port to provide an output signal;
a main tank circuit, including:
   a primary winding coupled to the input port; and
   a secondary winding coupled to the output port;
and
an auxiliary tank circuit, electrically isolated from the main tank circuit and electrically isolated from the output port, including:
   an auxiliary winding magnetically coupled to the primary winding and to the secondary winding;
   a termination capacitor coupled in parallel with the auxiliary winding; and
   a de-Q'ing resistor coupled in parallel with the termination capacitor.

9. A balun device, comprising:
a main tank circuit including a primary winding and a secondary winding magnetically coupled to each other; and
an auxiliary tank circuit, including:
   an auxiliary winding magnetically coupled to the primary winding and to the secondary winding; and
   a termination capacitor coupled in parallel with the auxiliary winding, wherein:
the primary winding and the secondary winding are physically interleaved with each other to form a loop; and
the auxiliary tank circuit lies within an interior area of the loop.

10. The balun device of claim 9, wherein the auxiliary tank circuit is electrically isolated from the main tank circuit and is electrically isolated from an output port of the balun device.

11. The balun device of claim 9, wherein the main tank circuit is to resonate at a first frequency, and the auxiliary tank circuit is to resonate at a second frequency different from the first frequency.

12. The balun device of claim 9, wherein a frequency response of the balun device comprises a combination of a resonance of the main tank circuit and a resonance of the auxiliary tank circuit.

13. The balun device of claim 9, wherein the auxiliary tank circuit further comprises:
   a de-Q'ing resistor coupled in parallel with the termination capacitor.

14. A balun device, comprising:
a main tank circuit including a primary winding and a secondary winding magnetically coupled to each other; and
a plurality of auxiliary tank circuits, each including:
   an auxiliary winding magnetically coupled to the primary winding and to the secondary winding; and
   a termination capacitor coupled in parallel with the auxiliary winding, wherein:
the primary winding and the secondary winding are physically interleaved with each other to form a loop; and
the plurality of auxiliary tank circuits lie within an interior area of the loop.

15. The balun device of claim 14, wherein each of the plurality of auxiliary tank circuits is electrically isolated from the main tank circuit and is electrically isolated from an output port of the balun device.

16. The balun device of claim 14, wherein the main tank circuit is to resonate at a first frequency, and each of the auxiliary tank circuits is to resonate at a respective one of a plurality of second frequencies, wherein each of the second frequencies is different from the first frequency.

17. The balun device of claim 14, wherein a frequency response of the balun device comprises a combination of a resonance of the main tank circuit and a respective resonance of each of the plurality of auxiliary tank circuits.

18. The balun device of claim 14, wherein each of the plurality of auxiliary tank circuits further comprises:
   a de-Q'ing resistor coupled in parallel with the termination capacitor.

* * * * *